(12) United States Patent
Katz et al.

(10) Patent No.: US 10,887,684 B2
(45) Date of Patent: *Jan. 5, 2021

(54) ACOUSTIC DEFLECTOR AS HEAT SINK

(71) Applicant: Bose Corporation, Framingham, MA (US)

(72) Inventors: Jason L. Katz, Ashland, MA (US); Richmond Andrew Real, Uxbridge, MA (US); Karl Edward Jacobson, Hubbardston, MA (US); Steven Carl Pletcher, Hopkinton, MA (US); George E. P. Chute, Milford, MA (US); Christopher John Breen, Framingham, MA (US); Kyle Brian McNicholas, Somerville, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/419,557

(22) Filed: May 22, 2019

(65) Prior Publication Data

US 2019/0273985 A1    Sep. 5, 2019

Related U.S. Application Data

(63) Continuation of application No. 15/475,542, filed on Mar. 31, 2017, now Pat. No. 10,306,356.

(51) Int. Cl.
*H04R 1/34* (2006.01)
*H04R 1/32* (2006.01)
*H04R 1/02* (2006.01)
*H05K 7/20* (2006.01)
*H05K 5/00* (2006.01)
*H04R 9/02* (2006.01)
*H04R 1/28* (2006.01)

(52) U.S. Cl.
CPC ............. *H04R 1/323* (2013.01); *H04R 1/021* (2013.01); *H04R 1/345* (2013.01); *H04R 9/022* (2013.01); *H05K 5/0086* (2013.01); *H05K 7/2039* (2013.01); *H04R 1/2834* (2013.01); *H04R 2201/028* (2013.01)

(58) Field of Classification Search
CPC ......................... H04R 9/022; H04R 2201/028
See application file for complete search history.

(56) References Cited

U.S. PATENT DOCUMENTS

| | | | | |
|---|---|---|---|---|
| 4,620,317 A * | 10/1986 | Anderson | ............... | H04R 1/345 181/155 |
| 5,418,336 A * | 5/1995 | Negishi | .................... | H04R 1/24 181/155 |
| 5,533,132 A * | 7/1996 | Button | ................... | H04R 1/028 181/199 |
| 6,259,798 B1 * | 7/2001 | Perkins | .................... | H04R 1/02 181/199 |

(Continued)

*Primary Examiner* — Fan S Tsang
*Assistant Examiner* — Ryan Robinson
(74) *Attorney, Agent, or Firm* — Bose Corporation

(57) ABSTRACT

An omni-directional acoustic deflector includes an acoustically reflective body having a substantially conical outer surface, and an inner surface opposite the outer surface. The inner surface defines a region that is configured to be coupled to a first electronic component such that heat is transferred from the first electronic component to the outer surface of the acoustically reflective body.

18 Claims, 4 Drawing Sheets

(56) References Cited

U.S. PATENT DOCUMENTS

| | | | | |
|---|---|---|---|---|
| 6,430,297 B1* | 8/2002 | Nakamura | ............ | H04R 1/021 |
| | | | | 181/148 |
| 6,496,373 B1* | 12/2002 | Chung | ................ | H01L 23/3737 |
| | | | | 156/306.6 |
| 6,944,024 B1* | 9/2005 | Devine, III | ............ | H04R 9/022 |
| | | | | 165/185 |
| 7,349,207 B2* | 3/2008 | Harris | .................... | H04R 9/022 |
| | | | | 361/690 |
| 7,388,963 B2* | 6/2008 | Han | .................... | H04R 1/2819 |
| | | | | 381/165 |
| 8,561,756 B2* | 10/2013 | Litovsky | .................. | H04R 1/02 |
| | | | | 181/198 |
| 8,798,308 B2* | 8/2014 | Litovsky | .............. | H04R 1/2834 |
| | | | | 381/397 |
| 8,837,763 B1* | 9/2014 | Millen | ................. | H04R 1/2834 |
| | | | | 181/145 |
| 9,736,560 B2* | 8/2017 | McGarry | .................. | H04R 1/02 |
| 10,045,461 B1* | 8/2018 | Boozer | .............. | H05K 7/20145 |
| 2005/0039879 A1* | 2/2005 | Hanai | .................. | H01L 23/367 |
| | | | | 165/46 |
| 2017/0094403 A1* | 3/2017 | Tipparaju | ................ | H04R 1/288 |
| 2018/0035187 A1* | 2/2018 | Cook | .................. | F21V 33/0056 |

* cited by examiner

ACOUSTIC DEFLECTOR AS HEAT SINK

CROSS-REFERENCE TO RELATED APPLICATIONS

This application is a continuation of U.S. patent application Ser. No. 15/475,542, filed Mar. 31, 2017, which is incorporated herein by reference in its entirety.

BACKGROUND

This disclosure relates to an acoustic deflector that also serves as a heat sink for heat dissipating electronic components.

SUMMARY

All examples and features mentioned below can be combined in any technically possible way.

In one aspect, an omni-directional acoustic deflector includes an acoustically reflective body having a substantially conical outer surface, and an inner surface opposite the outer surface. The inner surface defines a region that is configured to be coupled to a first electronic component such that heat is transferred from the first electronic component to the outer surface of the acoustically reflective body.

Implementations may include one of the following features, or any combination thereof.

In some implementations, the acoustically reflective body is formed of a material having a thermal conductivity of 50 W/m-K or greater (e.g., 96 W/m-K).

In certain implementations, the omni-directional acoustic deflector includes a plate that mounts to the acoustically reflective body to form an acoustic cavity therewith. The plate has an irregular surface.

In some examples, the plate mounts to the acoustically reflective body so as to form an acoustic seal therewith.

In certain examples, the irregular surface is arranged to accommodate a second electronic component.

In some cases, the irregular surface includes a feature along a first side of the plate that extends into the acoustic cavity.

In certain cases, the feature includes a bump that is arranged to accommodate placement of a second electronic component along a second side of the plate opposite the acoustic cavity.

In some implementations, the substantially conical outer surface is configured to be disposed adjacent an acoustically radiating surface of an acoustic driver, and the acoustically reflective body has a truncated conical shape that includes a top surface that is configured to be centered with respect to a motion axis of the acoustic driver. The acoustically reflective body has an opening in the top surface that extends into the acoustic cavity enabling acoustic energy from the acoustic driver to pass into the acoustic cavity.

In certain implementations, the inner surface of the acoustically reflective body defines a projection that includes the region for contacting the first electronic component.

In another aspect, a speaker system includes an acoustic enclosure; an acoustic driver coupled to the acoustic enclosure; circuitry for powering the acoustic driver; and an omni-directional acoustic deflector. The omni-directional acoustic deflector includes an acoustically reflective body that has a substantially conical outer surface that is configured to be disposed adjacent an acoustically radiating surface of the acoustic driver, and an inner surface opposite the outer surface. The inner surface defines a region that is configured to be coupled to a first electronic component of the circuitry, such that heat is transferred from the first electronic component to the outer surface of the acoustically reflective body.

Implementations may include one of the above and/or below features, or any combination thereof.

In some implementations, the speaker system includes a base that is configured to be coupled to the omni-directional acoustic deflector to form a compartment therebetween.

In certain implementations, the acoustically reflective body defines one or mounting posts for mounting the base to the omni-directional acoustic deflector.

In some examples, the circuitry is disposed within the compartment.

In certain examples, the speaker system includes a battery pack disposed within the compartment for powering the circuitry.

In some cases, the base forms a watertight seal with the omni-directional acoustic deflector.

In certain cases, the omni-directional acoustic deflector includes a peripheral edge with a first taper and the base includes a peripheral edge with a second taper that is configured to mate with the first taper to form the acoustic seal.

In some implementations, the region is coupled to the first electronic component via a thermal interface material.

In certain implementations, the thermal interface material has a thermal conductivity of at least 1 W/m-K (e.g., about 3 W/m-K).

In some examples, the thermal interface material is compressed between the first electronic component and the acoustically reflective body about 25% to about 75%.

In certain examples, the acoustic driver provides an alternating air flow along the outer surface of the omni-directional acoustic deflector which contributes to forced convective cooling.

In some cases, the acoustic enclosure includes a pair of passive radiators configured to be driven by acoustic energy provided by the acoustic driver such that the passive radiators are driven acoustically in phase with each other and mechanically out of phase with each other, to minimize vibration of the acoustic enclosure.

In certain cases, the acoustically reflective body comprises a leg for coupling the acoustically reflective body to the acoustic driver, such that the substantially conical outer surface is disposed adjacent to an acoustically radiating surface of the acoustic driver.

DETAILED DESCRIPTION

Multiple benefits are known for omni-directional speaker systems. These benefits include a more spacious sound image when the speaker system is placed near a boundary, such as a wall within a room, due to reflections. Another benefit is that the speaker system does not have to be oriented in a particular direction to achieve optimum high frequency coverage. This second advantage is highly desirable for mobile speaker systems where the speaker system and/or the listener may be moving.

This disclosure is based on the realization that a passive acoustic component (e.g., an acoustic deflector) of such an omni-directional speaker system could also serve another purpose as a heat sink for conducting heat away from a heat producing electronic component packaged within the speaker system. An alternating (a/c) air flow that is produced via the normal operation of an acoustic driver can be used to provide forced convective cooling for the passive acoustic component, thereby to further enhance heat transfer away from the heat producing electronic component.

In the examples described below, an acoustic deflector forms an upper wall of a sealed volume that contains electronics and a battery package (e.g., a lithium-ion battery). The electronics can include heat producing components, such as audio amplifiers and charge control circuitry for the battery package. This heat production can lead to undesirable thermal conditions in the sealed volume. Lithium-ion batteries, in particular, are subject to a limited operating range and therefore, heat is required to be efficiently transferred from the volume in order to improve the thermal conditions therein.

By creating the acoustic deflector out of thermally conductive material, and placing the acoustic deflector in contact with the heat producing component(s), the conduction of heat out of the enclosure volume is improved. In addition, the deflector resides adjacent the acoustic driver which acts as a source of an alternating air flow that contributes to a cooling effect of the acoustic deflector.

Figure 1A:
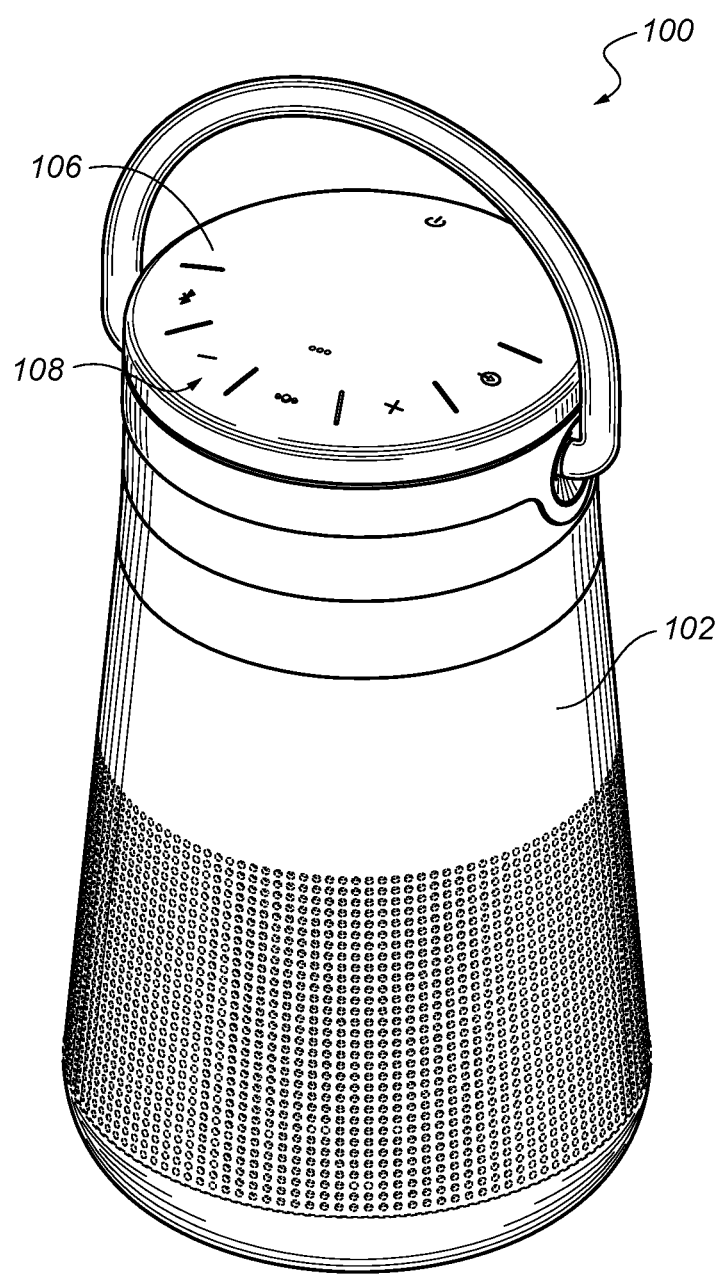
FIGS. 1A and 1B are perspective and cross-sectional views, respectively, of a speaker system.
Figure 1B:
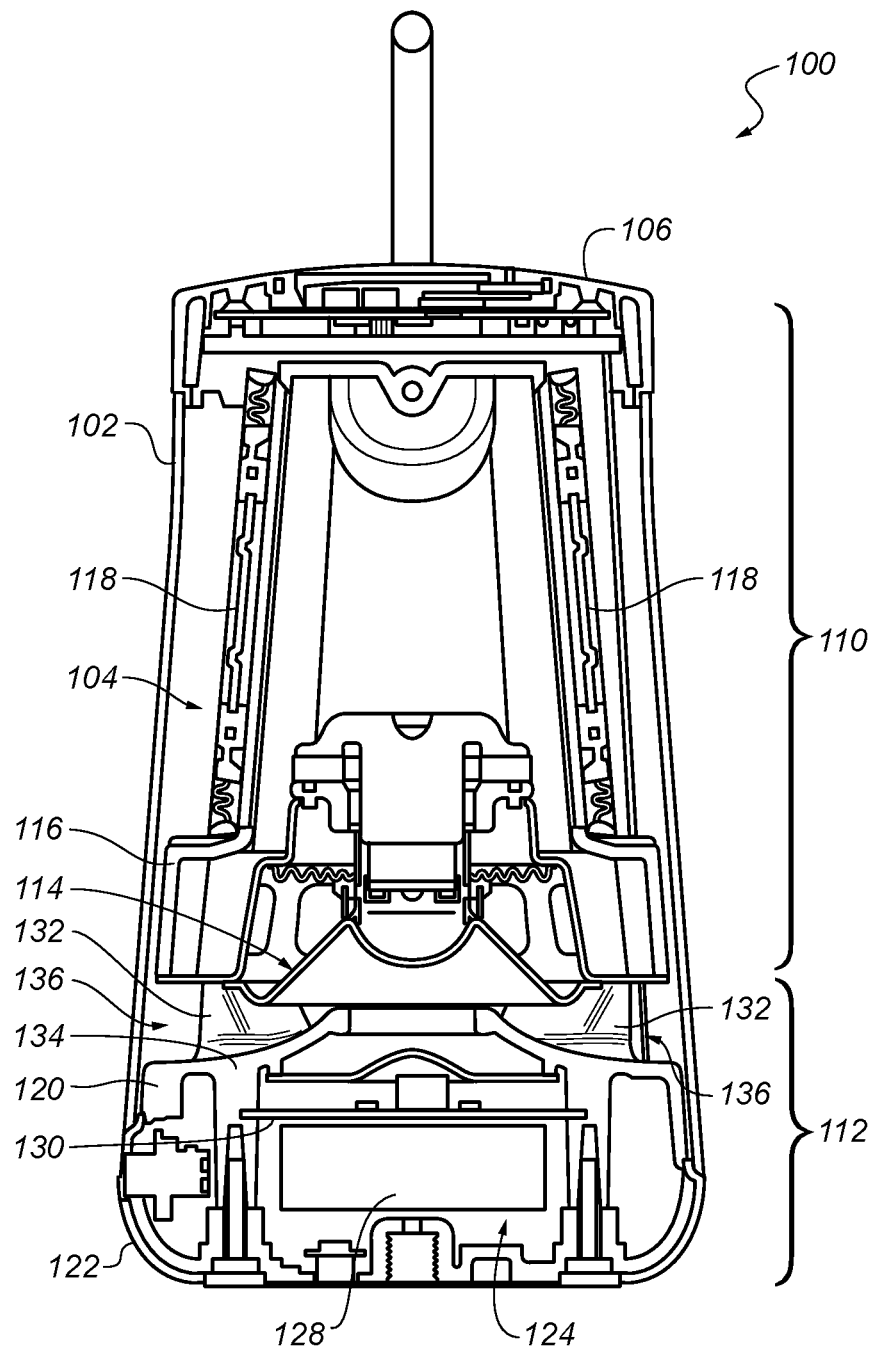

FIGS. 1A and 1B are drawings showing a perspective view and a cross-sectional view, respectively, of a speaker system 100 that includes an outer housing 102 in the form of a substantially cylindrical sleeve, which houses an acoustic assembly 104, and a top cap 106 which seals off a top end of the housing 102 and provides a physical user interface 108. The housing 102 includes a plurality of perforations which allow acoustic energy from the acoustic assembly 104 to pass therethrough.

Figure 2:
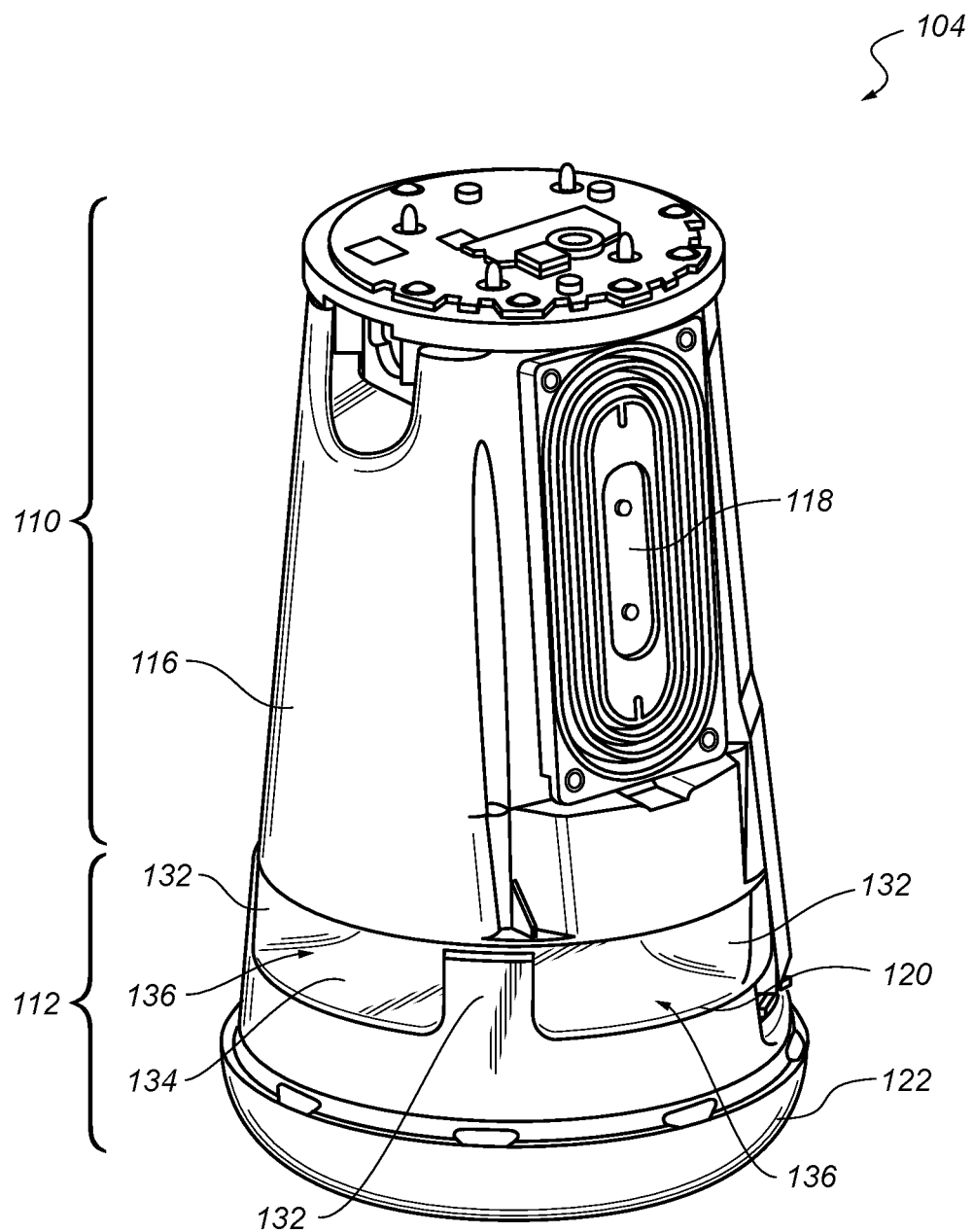
FIG. 2 is a perspective view of an acoustic assembly from the speaker system of FIG. 1A.

Referring to FIGS. 1B and 2, the acoustic assembly 104 is made up of an acoustic sub-assembly 110 and a deflector sub-assembly 112. The acoustic sub-assembly 110 includes a single downward firing acoustic driver 114 secured to a vertical acoustic enclosure 116. A pair of passive radiators 118 are arranged on opposing side walls of the enclosure 116. The passive radiators 118 are configured to be driven by audio signals from an audio source (not shown) such that the passive radiators 118 are driven acoustically in phase with each other and mechanically out of phase with each other, to minimize vibration of the enclosure 116.

The volume within the region above the acoustic driver 114 and inside the enclosure 116, as "sealed" with the passive radiators 118, defines an acoustic chamber. The diaphragms of the passive radiators 118 are driven by pressure changes within the acoustic chamber resulting from operation of the acoustic driver 114.

The deflector sub-assembly 112 includes an omni-directional acoustic deflector 120 and a bottom cap (a/k/a base 122), which are coupled together to form a compartment 124 that houses electronics, which power the speaker system 100. The electronics include a battery package 128, and a printed circuit board 130 that includes a plurality of electronic components mounted thereto. The electronic components 130 include, among other things, an amplifier chip and a battery charger chip. The battery package 128, however, may have a relatively low temperature limit. For example, in some cases, the battery package 128 has a temperature limit of about 52 degrees Celsius while charging and about 70 degree Celsius when not charging. As discussed below, to assist heat transfer out of the compartment 124 to provide for more suitable thermal conditions for the battery package 128, the acoustic deflector 120 can be formed from a high thermal conductivity material.

The omni-directional acoustic deflector 120 has four vertical legs 132 (a/k/a "mounting pillars") to which the enclosure 116 is mounted. Acoustic energy generated by the acoustic driver 114 propagates downward and is deflected into a nominal horizontal direction by an acoustically reflective body 134 of the acoustic deflector 120.

There are four substantially rectangular openings 136. Each opening 136 is defined by the enclosure 116, the acoustic deflector 120 and a pair of the vertical legs 132. These four openings 136 are acoustic apertures which pass the horizontally propagating acoustic energy. It should be understood that the propagation of the acoustic energy in a given direction includes a spreading of the propagating acoustic energy, for example, due to diffraction.

The illustrated acoustic deflector 120 has a nominal truncated conical shape that is configured to be centered (i.e., coaxial) with respect to the motion axis of the acoustic driver 114. In other examples, the slope of the conical outer surface between the base and vertex of the cone (a/k/a "cone axis") is not constant. For example, the outer surface may have a non-linear slant profile such as a parabolic profile or a profile described by a truncated hyperboloid of revolution. Notably, the body of the acoustic deflector 120 is made of a thermally conductive material (e.g., a material having a thermal conductivity of at least 50 W/m-K), such as a metal. In some cases, the body is formed of cast aluminum A380, which has a thermal conductivity of 96 W/m-K).

Figure 3:
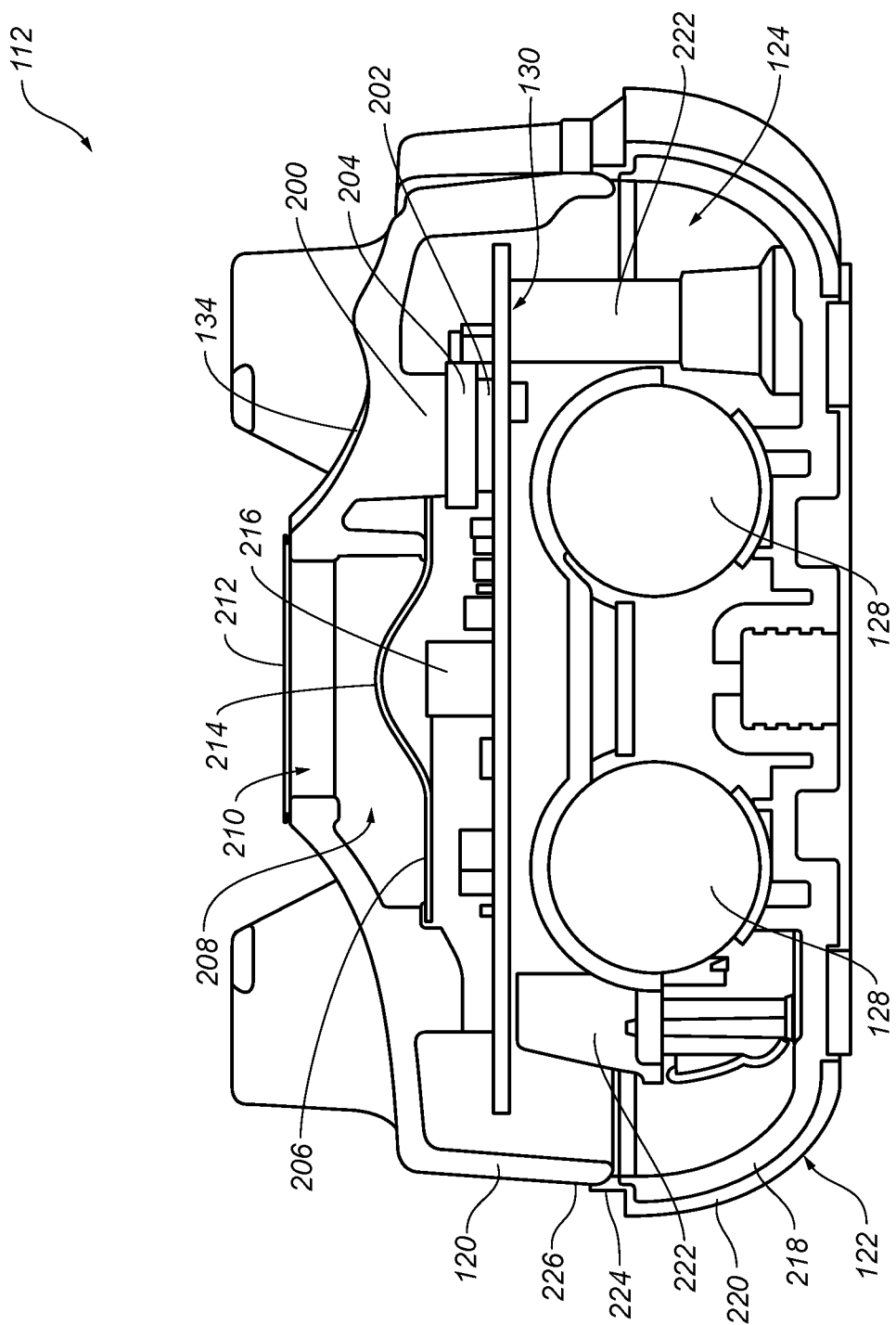
FIG. 3 is a cross-sectional view of a deflector subassembly from the acoustic assembly of FIG. 2.

Referring to FIG. 3, an inner surface of the body 134 defines one or more projections 200 (one shown) for contacting, either directly or indirectly, one or more of the heat dissipating electronic components (e.g., the amplifier chip and/or the battery charger chip) such that heat is transferred from the electronic component(s) to the outer surface of the acoustically reflective body 134. In the illustrated implementation, the projection 200 is coupled to a first electronic component 202 via a thermal interface material (e.g., a thermally conductive pad 204). In some cases, the thermally conductive pad 204 is formed of a compressible thermally conductive material. The use of a compressible material helps to accommodate dimensional tolerances to help eliminate air gaps. In some cases, the thermal interface material is compressed between the first electronic component 202 and the acoustically reflective body 134 about 25% to about 75%. Preferably, the thermally conductive pad 204 has a thermal conductivity of at least about 1 W/m-K, and, preferably, at least about 3 W/m-K. Suitable thermal pads are available from Parker Chomerics, Woburn, Mass., under the trade name THERM-A-GAP™ Thermally Conductive Gap Filler Pads.

Heat is conducted away from the electronic component(s) (e.g., the first electronic component 202) to the outer surface of the acoustically reflective body 134. The normal operation of the acoustic driver 114 provides an alternating (a/c) air flow along the outer surface which contributes to convective cooling of the acoustically reflective body 134. Through this convective and conductive heat transfer, sufficient heat is removed from the compartment 124 to provide suitable thermal conditions for the battery package 128.

Referring still to FIG. 3, a plate 206 is mounted to the acoustically reflective body 134 (e.g., via thread forming screws) to form an acoustic cavity 208 therewith. A gasket material can be provided at the interface between the plate 206 and the acoustically reflective body 134 to help ensure an air tight seal.

An opening 210 is provided in the top surface of the acoustically reflective body 134. The opening 210 extends into the acoustic cavity 208, thereby allowing acoustic energy from the acoustic driver 114 (FIG. 1B) to pass into the acoustic cavity 208. An acoustically absorbing material 212 is disposed in the opening. This acoustically absorbing material 212 attenuates the acoustic energy present near and at the peak of the lowest order circularly symmetric resonance mode. In some implementations, the diameter of the opening 210 is chosen so that the resulting attenuation of the acoustic energy propagating from the acoustic driver 114 (FIG. 1B) is limited to an acceptable level while achieving a desirable level of smoothing of the acoustic spectrum.

Notably, the plate 206 includes a bump 214 that is arranged to accommodate placement of one or more relatively tall components (e.g., a capacitor 216) on the printed circuit board 130. The bump 214 also provides an irregular surface within the acoustic cavity 208. This irregular surface can further help to break up certain acoustic standing waves.

In some implementations, the base 122 is a two shot molded plastic part and includes an inner bowl 218 that is molded from a polycarbonate (PC)/ABS; and an outer layer 220 formed of thermoplastic polyurethane (TPU). The base 122 provides the main support for the battery package 128 and printed circuit board 130. In that regard, the printed circuit board 130 is secured to the battery package 128 (e.g., with screws) to form an electronic sub-assembly. That electronic sub-assembly is then secured to the base 122 (e.g., with screws). The base 122 is then secured to bosses 222 formed in the acoustically reflective body 134 with thread forming screws. The base 122 includes a tapered peripheral edge 224, which engages a mating tapered edge 226 on the acoustically reflective body 134 to form a watertight seal. The TPU outer layer 220 on the base 122 helps to provide for a very tight seal with the acoustic deflector 120. This seal is helpful to protect the electronics against moisture, but it also keeps the heat trapped in the compartment 124, so the conductive acoustic deflector 120 becomes an instrumental component to the thermal cooling design.

The electronics 126 can be electrically connected to the acoustic driver 114 (FIG. 1B) and the user interface 108 (FIG. 1A) via wiring, which may pass through one or more apertures in the acoustically reflective body 134 and/or the acoustic enclosure 116. Grommets can be used to provide a seal between the wiring and the apertures.

A number of implementations have been described. Nevertheless, it will be understood that additional modifications may be made without departing from the scope of the inventive concepts described herein, and, accordingly, other implementations are within the scope of the following claims.

What is claimed is:

1. An omni-directional acoustic deflector comprising:
an acoustically reflective body having a conical outer surface configured to be disposed adjacent an acoustically radiating surface of an acoustic driver, and an inner surface opposite the outer surface, wherein the inner surface defines a region that is configured to be coupled to a first electronic component such that heat is transferred from the first electronic component to the outer surface of the acoustically reflective body, and
a plate that mounts to the acoustically reflective body to form an acoustic cavity therewith, the plate having an irregular surface,
wherein the region includes a battery pack for powering the first electronic component.

2. The omni-directional acoustic deflector of claim 1, wherein the acoustically reflective body is formed of a material having a thermal conductivity of 50 W/m-k or greater.

3. The omni-directional acoustic deflector of claim 1, wherein the plate mounts to the acoustically reflective body so as to form an acoustic seal therewith.

4. The omni-directional acoustic deflector of claim 1, wherein the irregular surface is arranged to accommodate a second electronic component.

5. The omni-directional acoustic deflector of claim 1, wherein the irregular surface includes a feature along a first side of the plate that extends into the acoustic cavity.

6. The omni-directional acoustic deflector of claim 5, wherein the feature comprises a bump that is arranged to accommodate placement of a second electronic component along a second side of the plate opposite the acoustic cavity.

7. The omni-directional acoustic deflector of claim 1, wherein the inner surface of the acoustically reflective body defines a projection that includes the region for contacting the first electronic component.

8. A speaker system comprising:
a housing; an acoustic enclosure within the housing;
an acoustic driver coupled to the acoustic enclosure;
circuitry for powering the acoustic driver, the circuitry comprising a first electronic component;
an omni-directional acoustic deflector entirely within the housing, the omni-directional acoustic deflector comprising an acoustically reflective body having a conical outer surface configured to be disposed adjacent an acoustically radiating surface of the acoustic driver, and an inner surface opposite the outer surface, wherein the inner surface defines a region that is configured to be coupled to the first electronic component, such that heat is transferred from the first electronic component to the outer surface of the acoustically reflective body; and
a plate that mounts to the acoustically reflective body to form an acoustic cavity therewith, the plate having an irregular surface.

9. The speaker system of claim 8, further comprising a base configured to be coupled to the omni-directional acoustic deflector to form a compartment therebetween.

10. The speaker system of claim 9, wherein the acoustically reflective body defines one or mounting posts for mounting the base to the omni-directional acoustic deflector.

11. The speaker system of claim 9, wherein the circuitry is disposed within the compartment.

12. The speaker system of claim 9, further comprising a battery pack disposed within the compartment for powering the circuitry.

13. The speaker system of claim 9, wherein the base forms a watertight seal with the omni-directional acoustic deflector.

14. The speaker system of claim 8, wherein the acoustically reflective body is formed of a material having a thermal conductivity of 50 W/m-K or greater.

15. The speaker system of claim 8, wherein the region is coupled to the first electronic component via a thermal interface material.

16. The speaker system of claim 8, wherein the acoustic driver provides an alternating air flow along the outer surface of the omni-directional acoustic deflector which contributes to forced convective cooling.

17. The speaker system of claim 8, wherein the acoustic enclosure comprises a pair of passive radiators configured to be driven by acoustic energy provided by the acoustic driver such that the passive radiators are driven acoustically in phase with each other and mechanically out of phase with each other, to minimize vibration of the acoustic enclosure.

18. The speaker system of claim 8, wherein the acoustically reflective body comprises a leg for coupling the acoustically reflective body to the acoustic driver, such that the conical outer surface is disposed adjacent to an acoustically radiating surface of the acoustic driver.

* * * * *